United States Patent [19]
Palm et al.

[11] Patent Number: 5,733,093
[45] Date of Patent: Mar. 31, 1998

[54] STACK TUBE FEEDER

[75] Inventors: Troy T. Palm, Minnetonka; Tim J. Hartman, Brooklyn Park; Kevin J. Barr, St. Paul, all of Minn.

[73] Assignee: Robodyne Corporation, Minneapolis, Minn.

[21] Appl. No.: 577,092

[22] Filed: Dec. 22, 1995

[51] Int. Cl.⁶ .................................................. B65B 69/00
[52] U.S. Cl. ................... 414/417; 414/900; 29/564.1; 221/88; 221/242; 227/127
[58] Field of Search ........................... 414/403, 404, 414/417, 797.9, 900; 29/564.1; 221/80, 87, 88, 242; 226/112; 227/43, 127, 139

[56] References Cited

U.S. PATENT DOCUMENTS

| | | |
|---|---|---|
| 3,286,740 | 11/1966 | Fuchs, Jr. et al. ............... 414/404 |
| 3,308,977 | 3/1967 | Cochran et al. ............... 414/404 |
| 3,443,707 | 5/1969 | Ficker et al. ............... 414/417 |
| 4,293,998 | 10/1981 | Kawa et al. ............... 29/564.1 |
| 4,761,106 | 8/1988 | Brown et al. ............... 414/403 |
| 4,862,578 | 9/1989 | Holcomb ............... 414/417 |
| 5,165,837 | 11/1992 | Schuppert, Jr. et al. ............... 414/417 |
| 5,251,405 | 10/1993 | Class et al. ............... 51/165.75 |
| 5,374,152 | 12/1994 | Tovini et al. ............... 414/403 |

OTHER PUBLICATIONS

AMP brochure entitled "High Volume Tube Feeder", Part No. 764800.
AMP brochure entitled "High Volume Gang of Tubes (GOT) Feeder", Part No. 768105.
AMP Customer Manual, CM 5813, Rev. A.
Chad Industries brochure entitled "Tube Magazine Feeder".
Robotic Delivery Systems brochure entitled "Molex Automatic Tube Magazine Unloading System".
Component Express Corporation brochure entitled "Automatic Connector Feeder (ACF)".
Component Express Corporation brochure entitled "Versatile, Reliable, Electronic Component Feeding from Shipping Tubes".

*Primary Examiner*—David A. Bucci
*Assistant Examiner*—Douglas Hess
*Attorney, Agent, or Firm*—Faegre & Benson

[57] ABSTRACT

A stack tube type feeder is designed to be versatile to dispense a variety of parts. The part dependent components of the feeder can be either selectively interchanged or adjusted to accommodate a wider variety of parts. Specifically, a part feeder includes a tube guide assembly for holding a plurality of part supply tubes. Within the tube guide assembly removable front and rear stops prevent longitudinal movement of the part supply tube in the feed position. Included is a removably mounted guide track element having a guide track as part of the feed guide path. The changeover mechanism of the present invention includes removable front and rear tube supports for supporting the part supply tube in the feed position, and removable and adjustable front and rear singulator elements for supporting a next fed tube in a staging position. Preferably, a pusher mechanism includes a pusher tape and pusher element which are driven to advance the parts from the part supply tubes. Both are preferably replaceable and/or reorientable. Another aspect of the present invention is to provide the replaceable parts in kit form so that a part feeder in accordance with the present invention can be easily modified to accommodate a variety of components or parts.

18 Claims, 12 Drawing Sheets

STACK TUBE FEEDER

TECHNICAL FIELD

The present invention is directed to a high volume feeder device for presenting electrical connectors and components for robotic pick-up in a robotic assembly system. More specifically, the present invention is directed to a tube feeder device wherein the connectors or components are provided in magazines or tubes which can be stacked on top of one another and from which the parts are sequentially dispensed.

BACKGROUND OF THE INVENTION

Robotic assembly systems are now commonly utilized in the production of electronic circuit boards and the like. Such systems typically include a robot that picks up electrical connectors and/or components from one or more feeders and which secures one or more of the parts to a board. Such robots can be programmed to handle any number of placements, provided that they are programmed with the specific location of each part to be pick-up. Thus, an important requirement of a part feeder is that the part to be picked-up is provided in a precise location that can be programmed within the robot control system.

Such robotic assembly systems are also designed to run at continuous production levels that require a substantially constant supply of electrical parts for pick-up and placement. So, in addition to precise part location, it is desirable to have a feeder that can precisely provide the electrical parts to the robot without having to stop production or shutting down the robot for an indefinite length of time.

Electrical parts are commonly supplied within a magazine or tube. That is, the parts are provided within tubes that are open at both ends in a single-file line. Then, by either using gravity or providing a force from one open end of the tube against the last part within the tube, the parts can be sequentially dispensed. Part feeders for use in a robotic assembly systems have been designed utilizing either a gravity or force feed for advancing the parts along a track designed for the specific part from which the part can be picked-up by a robot. In order to provide the parts to a precise location; feeders have been made having a stop at the end of the track from which the leading part can be picked. The stop locates the leading part at the precise location programmed into the robot control system, and after the leading part is picked, a new leading part advances to the stop position under the influence of gravity or an applied force for next pick-up. When the tube is empty, a new tube must be loaded in the feeder leaving only those parts within the length of the track available for pick-up, provided that the parts within the track continue to advance during tube replacement. If not, the process will be interrupted. Even if the parts continue to advance, it is a significant disadvantage requiring operator time to have to change tubes as each one empties and to do so without significant interruption.

Feeders have been developed to provide more of a continuous supply of parts requiring less operator time having a stack of full tubes. Such stack tube feeders also operate, as above, by gravity or applied force feed and include automatic changeover mechanisms for dispensing with empty tubes and loading new tubes in feeding location along a feed track. The stack of tubes is typically facilitated by a vertical guide assembly sized to the tube dimensions that allows the new tube to fall in place after the spent tube is discarded. Thus, operators need only add full tubes to the stack when the stack gets low to provide a substantially constant supply of parts. However; stack tube feeders require more parts and manufacturing steps than simpler feeders which increase the costs of production.

As noted above, the feed track and the tube guide assembly are dependent on the shape and size characteristics of the part and tube, respectively. The tube shape and size is likewise dependent on the part and the number of them in a full tube. As a result, the feeder itself comprising its tube guide assembly and feed track must be customized for the particular part to be dispensed. This disadvantageously leads to the design of many specific feeders depending on the part to be fed. Circuit board assemblers, for example, thus need to have more feeders on hand to accommodate the various connectors and/or components used in their assembly process.

There is thus a need for part feeders to utilize the advantageous features of stack tube feeders, but to minimize the requirement for specifically designed feeders for the various parts encountered in an assembly process.

SUMMARY OF THE INVENTION

An improved stack tube type feeder is designed in accordance with the present invention which is suitable for providing small parts, such as electrical connectors and components, and which is more versatile in that it can be easily modified and adjusted to accommodate part variations. Moreover, the part dependent components of the feeder can be either selectively interchanged or adjusted to accommodate a wider variety of parts and thereby minimize the need for many specifically designed feeder devices.

Specifically, a part feeder for use in a robotic assembly system in accordance with the present invention includes a tube guide assembly for holding a plurality of part supply tubes and for defining a feed position for the part supply tube within the feed guide path of the part feeder. Within the tube guide assembly a first guide member is provided with a removable front stop for preventing forward movement of the part supply tube in the feed position and includes an opening for permitting parts from the part supply tube to pass through in the direction of said feed end. A second guide member has a removable rear stop for preventing rearward movement of the part supply in the feed position and has an opening providing access to the part supply tube. A feed track assembly is provided along the feed guide path and is positioned for guiding parts from the part supply tube in the feed position, and includes a removably mounted track element having a guide track for providing a portion of the feed guide path and a track stop for defining a reference location usable by the robotic assembly system. A pusher assembly is operatively positioned before the tube guide assembly for applying a force against a part within the part supply tube by way of the access opening of the rear stop for advancing the parts from the part supply tube and along the feed track.

Moreovers to increase versatility, the changeover mechanism of the present invention includes removable front and rear tube supports for supporting the part supply tube in the feed position, and removable and adjustable front and rear singulator elements for supporting a next fed tube in a staging position. Preferably, the pusher means includes a pusher tape and pusher element which are driven to advance the parts from the part supply tubes. Both are preferably replaceable and/or reorientable.

According to another aspect of the present invention, lift nest feed device or a shuttle feed can be incorporated into the track element of the present invention. The purpose of these features is to separate the leading part or component from the rest for pick-up by a robot. With the lift nest feature, the leading part is raised from the rest in the guide track. With the shuttle, the leading part or component is advanced separately from the rest at the pick-up location.

Also in accordance with the present invention, the above-noted replaceable parts can be provided in kit form so that a part feeder in accordance with the present invention can be easily modified to accommodate a variety of components or parts. The replaceable parts can include the front and rear stops, the front and rear singulators, the track element, the pusher, pusher tape, and pusher pocket assembly, among others.

DETAILED DESCRIPTION OF THE PREFERRED EMBODIMENTS

Figure 1:
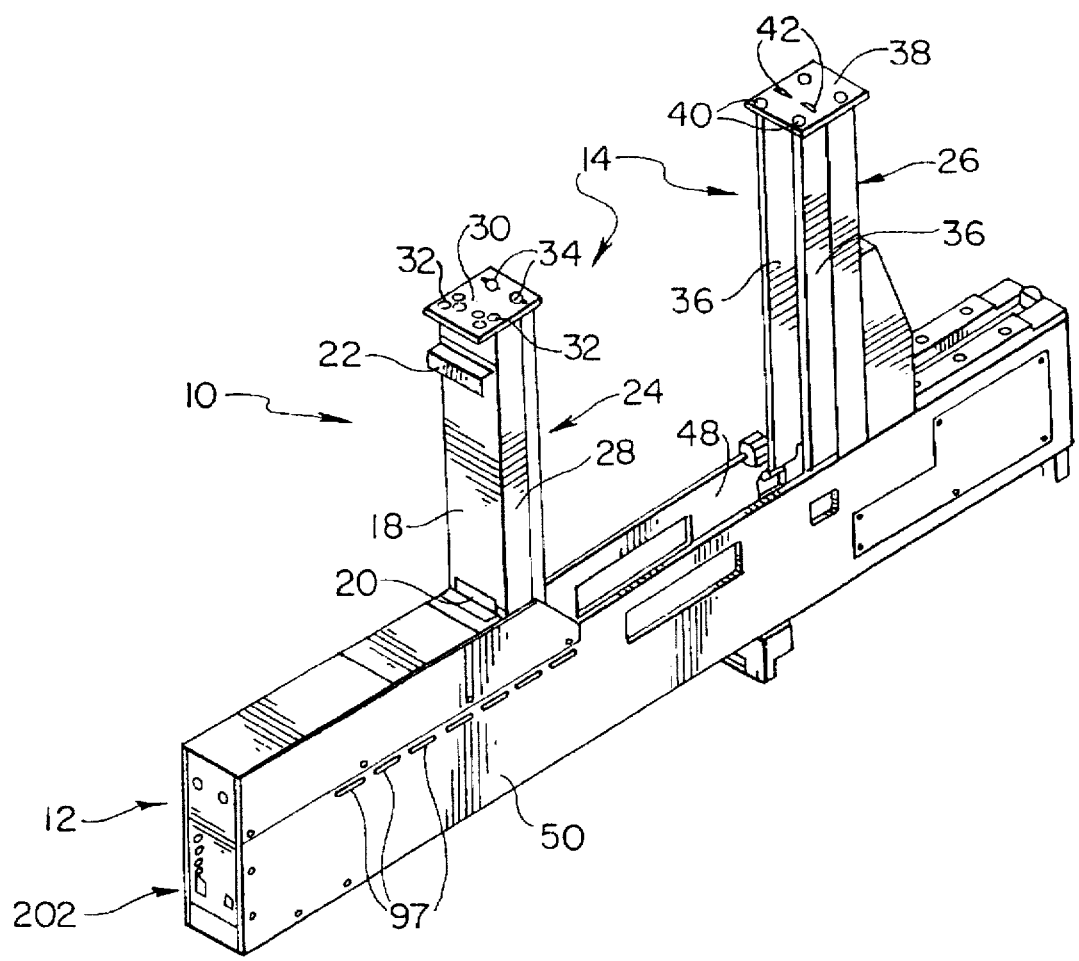
FIG. 1 is a perspective view of a stack tube feeder in accordance with the present invention.
Figure 2:
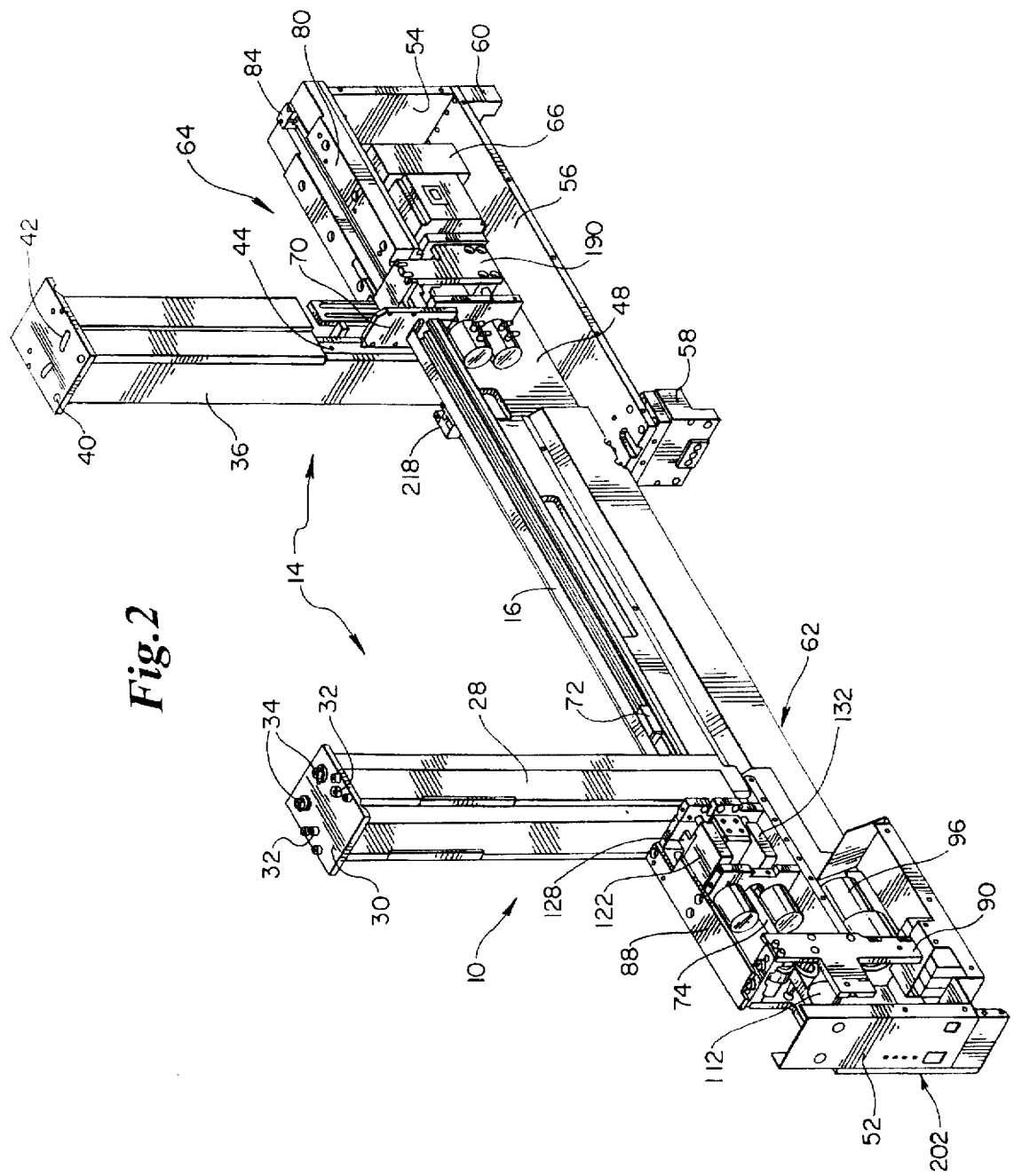
FIG. 2 is a perspective view of the stack tube feeder of FIG. 1 with its side housing removed and portions of the housing broken away.

With reference to the accompanying Figures, wherein like components are numbered similarly throughout the several Figures, and initially to FIGS. 1 and 2, a stack tube feeder 10 in accordance with the present invention is illustrated.

The stack tube feeder 10 comprises a multipart support or housing 12 and a tube guide assembly 14, which permits the stacking of a limited number of tubes 16 (shown in FIG. 3) which are conventionally used for supplying electronic components and connectors. The tubes 16 are stacked vertically within the tube guide assembly 14, one on top of another, and are supported at the bottom within a part feed guide path, as described below. Access to the tube guide assembly 14 for the purpose of stacking tubes within the tube guide assembly 14 is preferably provided by a swinging door 18 mounted by a hinge 20 to a top surface of the multipart housing 12. Preferably, also, the door 18 is biased about hinge 20 by a torsion spring (not shown) urging door 18 toward its closed position, shown in FIG. 1. A handle 22 is also preferably provided for manipulating the door The tube guide assembly 14 basically comprises a first guide 24 and a second guide 26. First guide 24 comprises a pair of adjustable side plates 28 (only one shown in FIG. 1) and a top end cap 30. Side plates 28 are adjustable in that they are pivotally moveable about longitudinal axes defined at pivot points 32 on the top end cap 30 and which are fixed in position by a slot and screw arrangements at 34 also acting with top end cap 30. By this arrangement, the distance between the longitudinal free edges of the adjustable side plates 28 can be varied in accordance with the width of a tube 16 to be guided within the tube guide assembly 14.

The second guide 26 likewise comprises a pair of adjustable side plates 36 and a top end cap 38. In this case, the side plates 36 are moveable about longitudinal pivots defined at pivot points 40 and are adjustably fixed in position by screw and slot arrangements at 42. In this case, it is an inner free longitudinal edge of the adjustable side plates 36 which are adjustable relative to one another to define the distance therebetween in accordance with the width of the tube 16 to be supported therein. The longitudinal inner edges are adjacent to a back support wall 44 also supported between the top end cap 38 and the housing 12, see FIG. 2. As also shown in FIG. 2, a pivot support block 46 is provided mounted to a sidewall 48 of the housing 12 for pivotally supporting a lower end of an adjustable side plate 36 of the second guide 26. A conventional pin and socket arrangement is preferable. Likewise, the lower end of the other adjustable side plate 36. Pivotal support for the lower ends of side plates 28 of the first guide 24 will be described below. By this arrangement, the width of the tube receiving openings within the first and second guides 24 and 26 can be easily adjusted from above in accordance with the width of the tubes 16 which are to be stacked within tube guide assembly 14.

Housing 12 preferably comprises the first sidewall 48, a second sidewall 50 a first end plate 52, a second end plate 54, and a bottom plate 56 extending only partially from end plate 54 along side plates 48 and 50. Bottom plate 56 preferably includes the appropriate mounting hardware at 58 and 60 for providing an easy interconnect of the stack tube feeder 10 in a robotic assembly system.

With reference to FIG. 2, the stack tube feeder 10 is basically comprised of the tube guide assembly 14, a rear pusher assembly 62, a feed assembly 64, and a programmable logic controller 66. The tube guide assembly 14 locates a bottom tube 16 in a feed guide path aligned with the feed track assembly 64. The rear pusher assembly 62 is also aligned with the feed guide path for pushing the parts within the bottom tube 16 through the feed track assembly 64 for pick-up by a robot in a robotic system.

Figure 3:
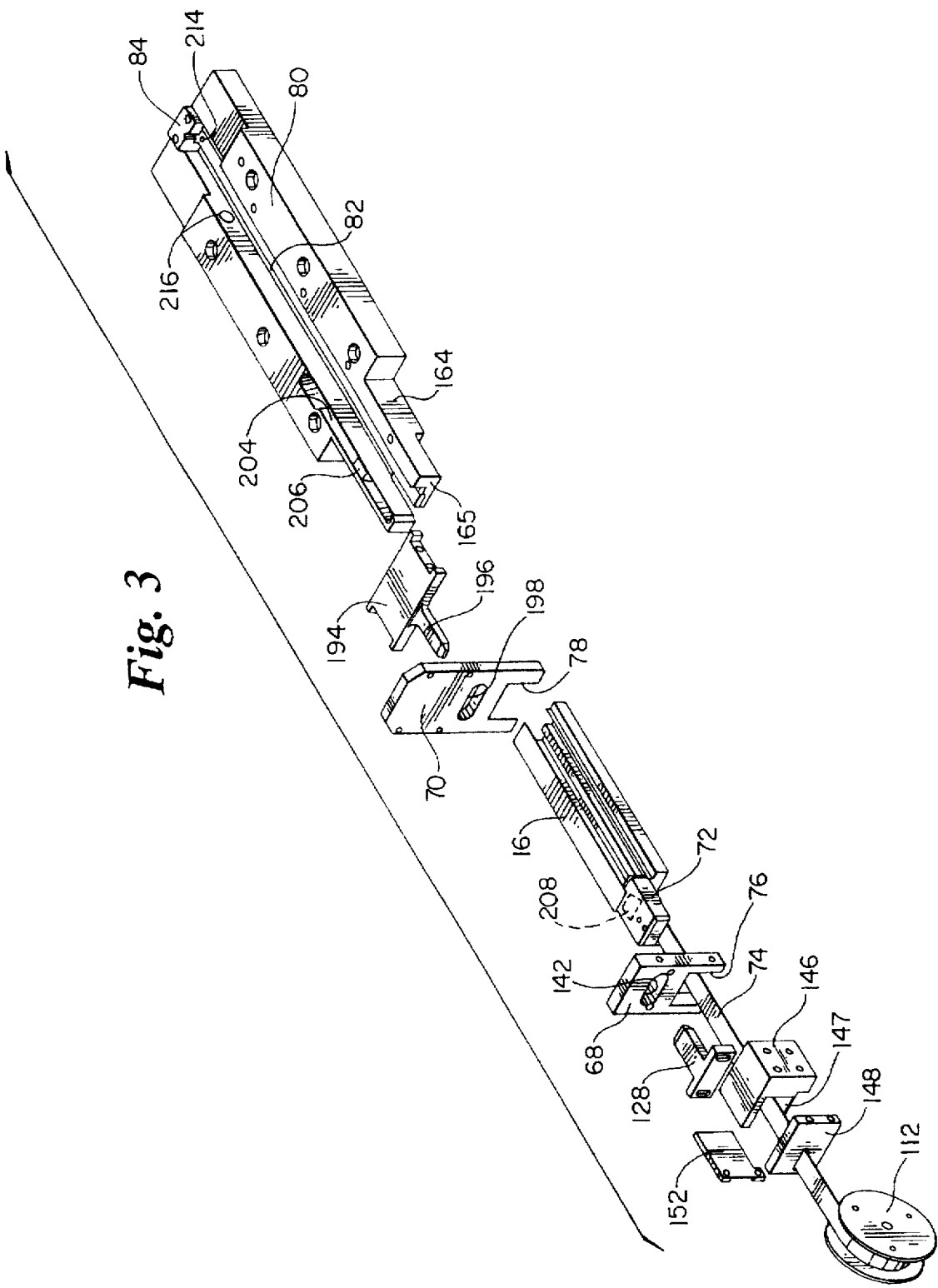
FIG. 3 is a schematic view of the part feeder system of the stack tube feeder of the present invention including a positive feed system, a supply tube and feed track.

This basic operation is schematically shown in FIG. 3. Tube 16, containing component parts, is located between a rear stop 68 and a front stop 70. The rear pusher assembly 62 includes a pusher 72 connected to a leading edge of a pusher tape 74, which is driven in a manner detailed below. An opening 76 of the rear stop 68 is preferably just sufficiently sized so that the pusher 72 can pass therethrough and into the opening of a tube 16. Pusher 72 then urges parts within tube 16 through an opening 78 of the front stop 70. Preferably, the opening 78 is sized to just permit the passage of the parts and the pusher 72. Parts are thus pushed from tube 16 through opening 78 and along a track plate 80 having a component guide track 82. Guide track 82 is preferably designed to accommodate the specific part to be dispensed from tube 16 in a particular operation. At the end of the component guide track 82, a track stop 84 is provided defining the location to be programmed into a robotic system as the pick-up location for a specific part or component.

Figure 4:
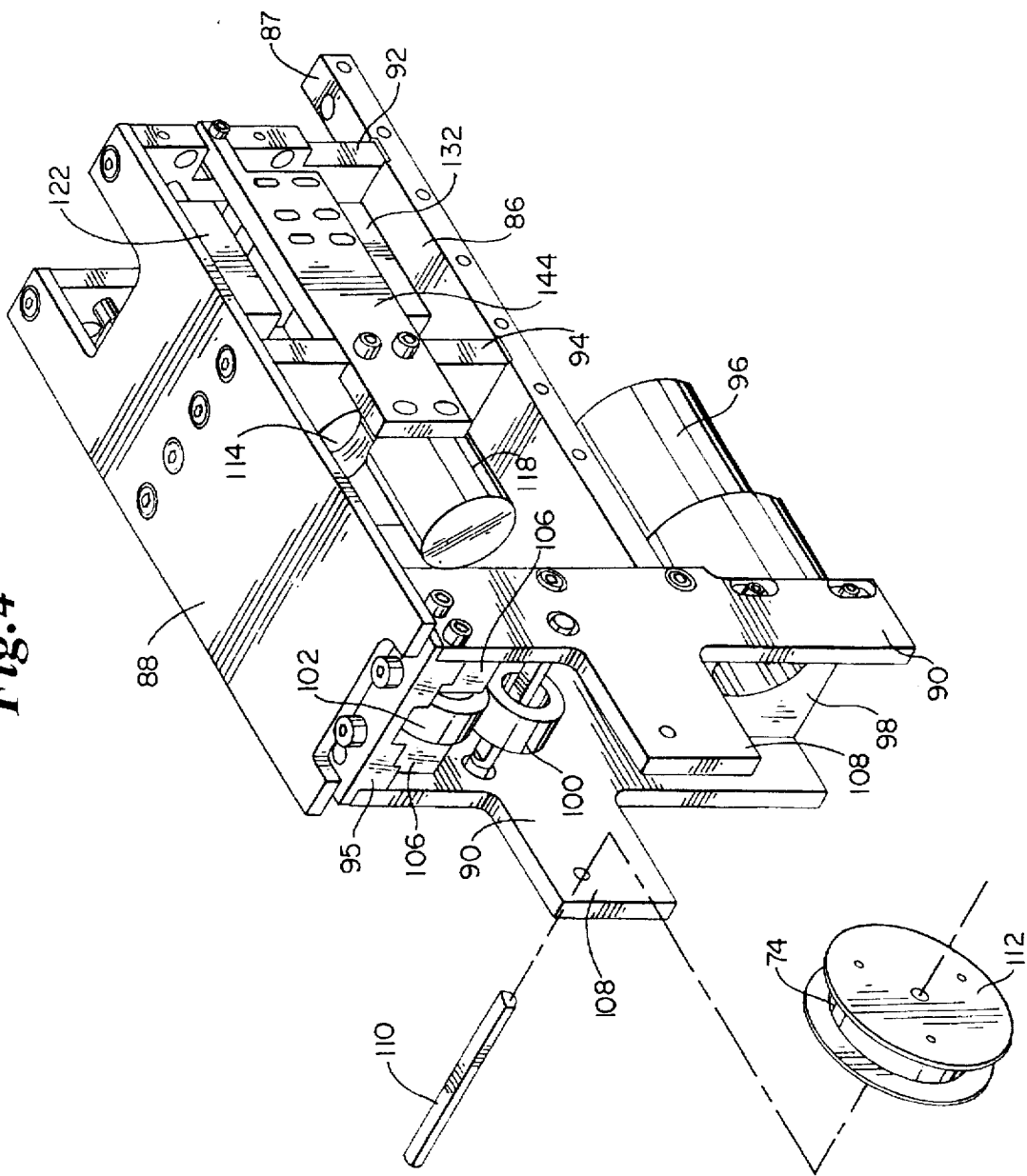
FIG. 4 is a perspective view of a positive feed system subassembly usable in the stack tube feeder of the present invention.

With reference to FIGS. 4–7, and initially to FIG. 4, the rear pusher assembly 62 will be described included are a lower support plate 86, an upper support plate 88, a pair of rear support arms 90, a front support plate 92 and an intermediate support plate 94. The upper and lower support plates 88 and 86, respectively, are connected together by way of the front and intermediate support plates 92 and 94, respectively, to make the rear pusher assembly supporting structure. Rear support arms 90 are preferably mounted to the sides of the lower support plate 86 and provide the support for the drive assembly, described below. A mounting block 96 is preferably connected between the upper ends of the rear support arms 90. At the forward end of the lower support plate 86, extensions 87 provide the pivotal support for the lower ends of side plates 28 of first guide 24, described above. This structure of the rear pusher assembly 62 is preferably connected between sidewalls 48 and 50 of the multipart housing 12, such as by the use of conventional screws connecting the sidewalls to the lower support plate 86. Moreover, slots 97 are provided through the sidewalls 48 and 50, as shown in FIG. 1, to permit adjustment of the position of the rear pusher assembly 62 and the first guide 24 along the direction of the feed guide path. By this, various lengths of tubes 16 can be accommodated.

The drive system comprises a motor 96, which is preferably a small low-voltage DC gearhead motor. Moreover, the motor 96 is of the type that is turned on and off with a typical relay circuit and which is controlled by the programmable logic controller 66. The motor 96 is preferably geared for nominal speed and torque required for average component requirements. Motor 96 is connected with the rear support arms 90 by way of a connecting plate 98 provided between the lower portions of the rear support arms 90. Mounted in the upper portion of the rear support arms 90, are a drive roller 100 and a tension idler roller 102. Drive roller 100 is conventionally provided on an axle 104 to rotate therewith, the axle 104 being conventionally supported between the rear support arms 90 by way of rotational bearings or bushings (not shown). Tension roller 102 is preferably supported between blocks 106 which are in turn compliantly connected to the mounting block 95 connected between the upper ends of rear support arms 90. Preferably, blocks 106 are conventionally adjustably biased to move from mounting block 95 toward drive roller 100 for providing an adjustable frictional drive as will be apparent from the description below. Drive roller 100 is driven by motor 96 by way of a transfer mechanism, preferably a miniature toothed belt (not shown) which runs between toothed pulleys (not shown), one rotationally fixed with axle 104 and the other provided on the shaft of motor 96. Such a belt can convert 90 degrees of rotation between the axis of rotation of the axle 104 and that of the shaft of motor 96. Miter gearing can alternatively be used. By this arrangement, a friction drive is created for driving the pusher tape 74. When the pusher tape 74 cannot advance for any reason, the drive roller 100 will simply slip against the surface of the pusher tape 74. Alternatively, a conventional slip clutch could be incorporated into the drive transfer mechanism. Reference is made to U.S. Pat. No. 3,308,977 which discloses a pusher tape drive which is suitable for use with the present invention, the entire contents of the U.S. Pat. No. 3,308,977 incorporated herein by reference.

The rear support arms 90 include rearwardly extending intermediate portions 108 which are used to support an axle 110 on which a reeler 112 is rotatably supported and which is wound with a spring tape (not shown) and pusher tape 74. The spring tape is used in a conventional manner to rewind the pusher tape 74 on the reel. The pusher tape 74 preferably comprises a steel tape, but any material capable of pushing the pusher 72 without longitudinal collapse, is contemplated, including plastics, metals, and the like. In operation, tape 74 is threaded between the nip of tension roller 102 with drive roller 100 and further as described below. Motor 96 provides the driving force to roller 100 which drives against the lower surface of the pusher tape 74 for frictionally driving the pusher tape 74 in forward or reverse. The tension applied by roller 102 provides the adjustable horizontal drive force to the pusher tape 74 when needed but permits slippage when the pusher tape 74 cannot advance.

Figure 5:
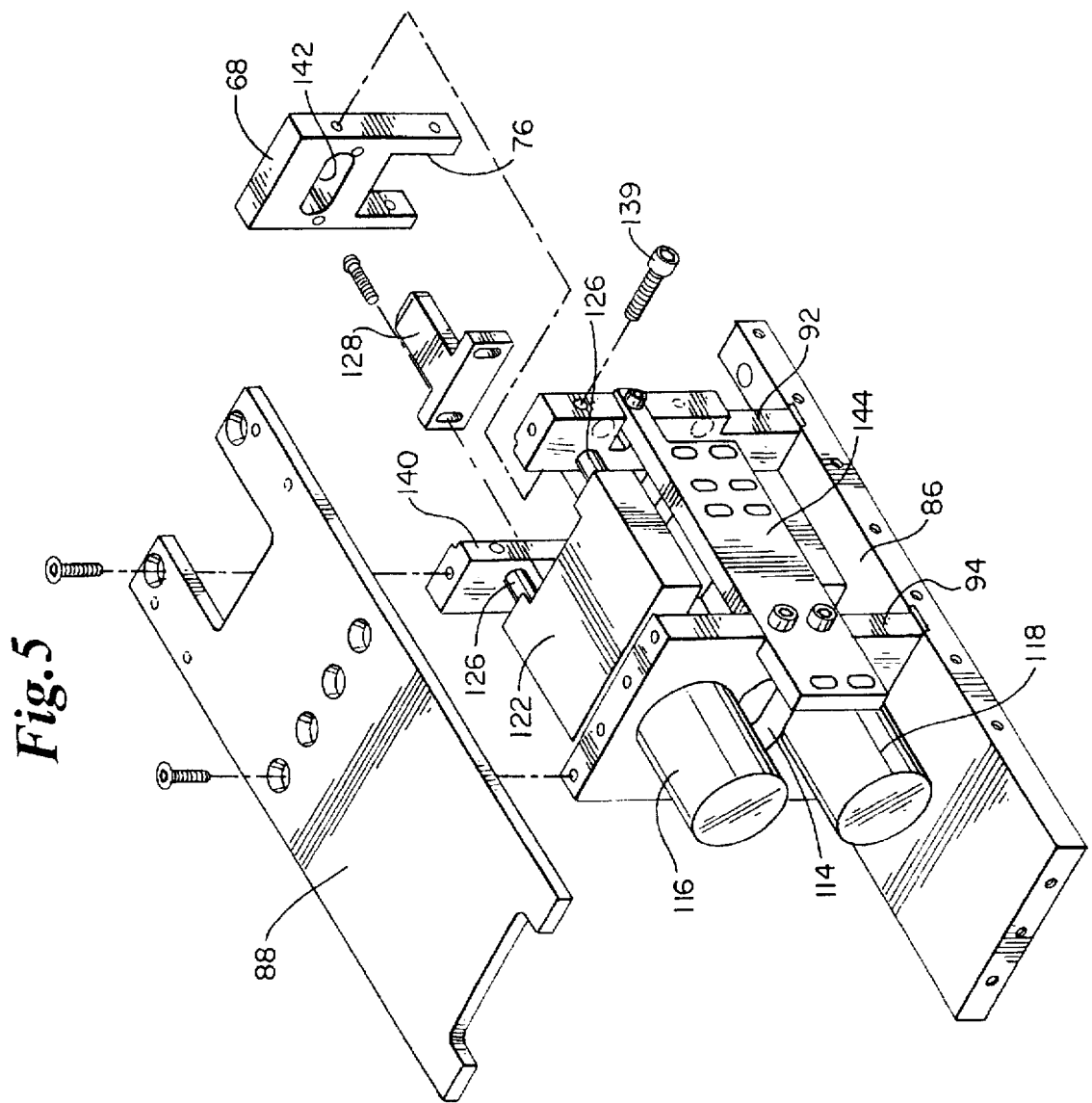
FIG. 5 is a partial exploded view of the positive feed system subassembly of FIG. 4 and showing a rear stop through which a pusher can enter a part supply tube.
Figure 6:
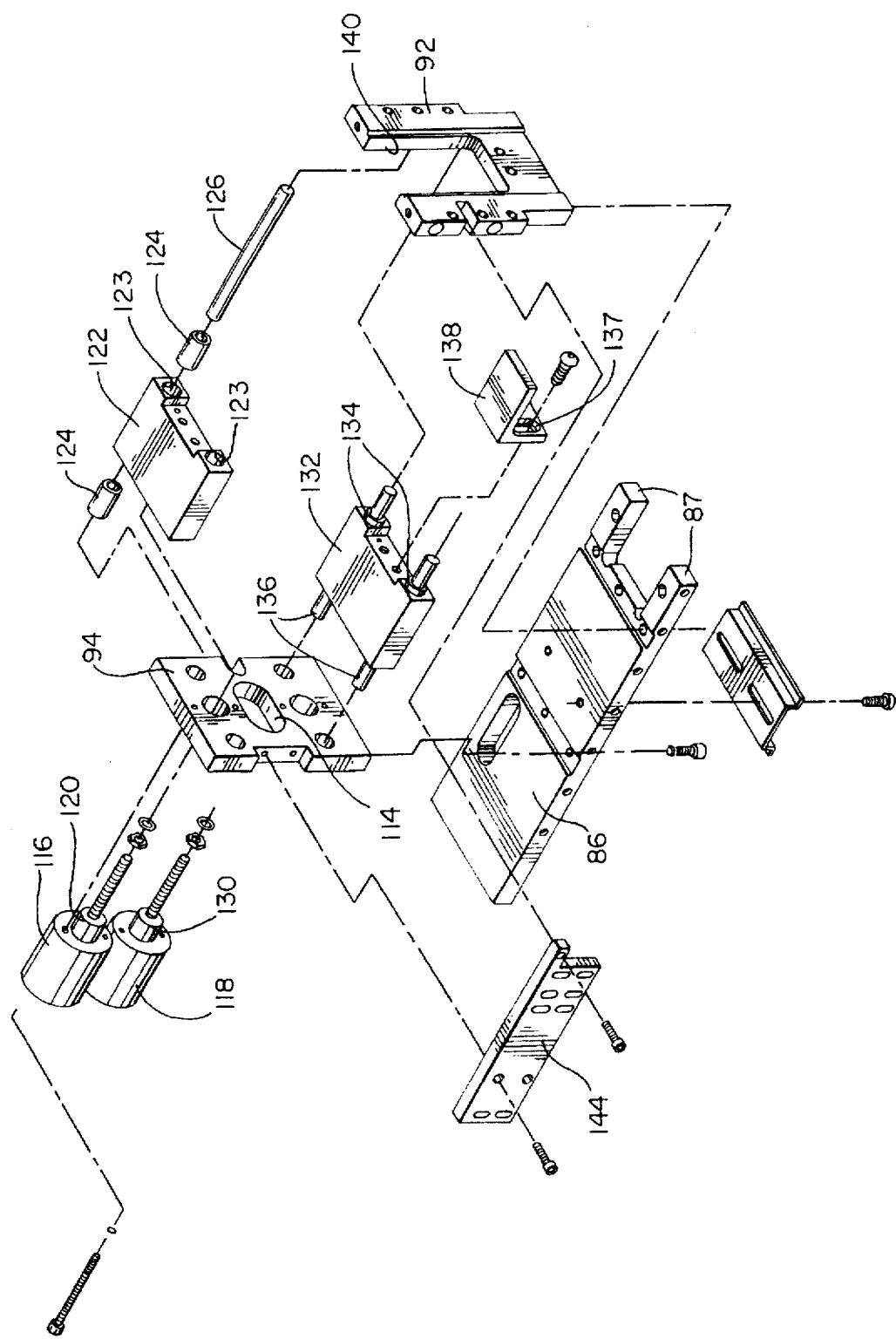
FIG. 6 is an exploded view of a portion of the positive feed system subassembly of FIG. 4 from a reverse perspective.

As shown more clearly in FIGS. 5 and 6, the intermediate support plate 94 includes and opening 114 through which the pusher tape 74 is threaded and also supports an upper air cylinder 116 and a lower air cylinder 118. Upper air cylinder 116 is mounted to an upper portion of the intermediate support plate 94 and includes a rod 120 moveable through an opening of the plate 94 between an extended and retracted position. The rod 120 is connected with an upper slide block 122 having a pair of parallel bores 123 into which bearing inserts 124 are provided (only one set shown in FIG. 6) and which ride on a pair of upper guide rods 126 (only one shown in FIG. 6) which are mounted between the front support plate 92 and the intermediate support plate 94. As shown in FIG. 5, a rear singulator finger 128, the purpose of which will be described below, is mounted to the front face of upper slide block 122. The rear singulator may also be provided with mounting slots permitting vertical adjustment thereof with respect to the upper sliding block 122. By this arrangement, the upper sliding block 122 and the rear singulator finger 128 are moveable between extended and retracted positions with rod 120 by way of guide rods 126.

Lower air cylinder 118 likewise includes a rod 130 moveable between extended and retracted positions. Air cylinder 118 is mounted to a lower portion of the intermediate support plate 94 with the rod 130 extending through an opening of the intermediate support plate 94 and connected with a lower slide block 132. Like the upper slide block 122, the lower slide block 132 includes parallel bores (not shown) within which bearing inserts 134 are provided and which ride on lower guide rods 136 supported between the front support plate 92 and the intermediate support plate 94. At the front end of the lower slide block 132, a rear tube support 138 is mounted. Preferably, rear tube support 138 is vertically adjustably mounted to the lower slide block 132, such as by slots 137 (only one shown). Thus, for reasons described below, the rear tube support 138 moves with the lower slide block 132 and rod 130 between extended and retracted positions while supported on the lower guide rods 136.

As shown in FIG. 5, the rear stop 68 is preferably selectively mounted by screws 139 to the front support plate 92 of the rear pusher assembly 62 within a cutout 140 of the front support plate 92. A singulator slot 142 is also provided through the rear stop 68, and when the rear stop 68 is mounted to the front support plate 92, the rear singulator finger 128 is positioned to selectively pass through the singulator slot 142 when the rod 120 of the upper air cylinder 116 is extended. When the rear singulator finger 128 is extended, it passes entirely through the singulator slot 142 of the rear stop 68 and is insertable within a tube 16 in a staging position that is located just above the tube 16 in a feed position within the feed guide path for holding the staged tube and those stacked thereon during ejection of the lower tube within the feed position when it is empty, and as further described below. Movement of the rear tube support 138, by way of rod 130, moves an upper surface of the rear tube support 138 selectively to a position under the lowermost tube that lies within the feed guide path for supporting that lowermost tube in feed position while rod 130 is extended. When rod 130 is retracted, the upper surface of rear tube support 138 moves at least beneath the front support plate 92 so that the rear end of the tube within the feed position can fall.

Figure 7:
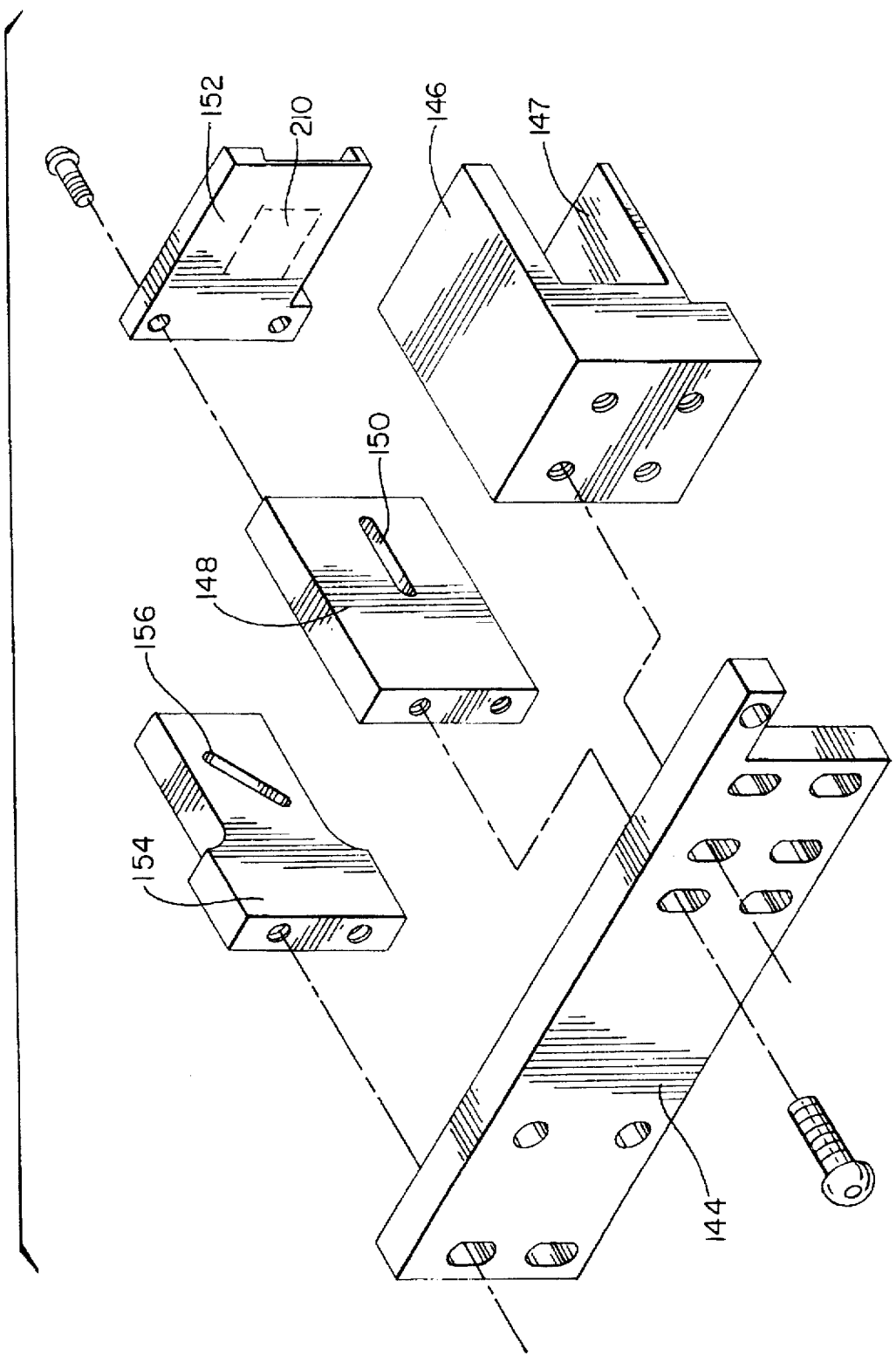
FIG. 7 is an exploded perspective view of a pusher pocket, guide, and optional guide element within the positive feed system subassembly of FIG. 4.

Also within the rear pusher assembly 62 is a pusher pocket subassembly located between the upper slide block 122, the lower slide block 132, intermediate support plate 94 and front support plate 92. Specifically, a tooling bar 144 is preferably mounted to one side of both the front support plate 92 and the intermediate support plate 94. As best seen in FIG. 7, mounted near the forward end of the tooling bar 144 is a pocket element 146 including a cut out defining a pocket 147 which is designed for receiving the pusher 72. Mounted just rearward of the pocket element 146 is a pocket stop 148 which defines the limit of rearward movement of pusher 172. Pocket stop 148 includes a slot 150 which accommodates the passage of pusher tape 74. A side cover 152 is also preferably provided and mounted to the side of the pocket stop 148 which together with the pocket stop 148 and the pocket element 146 provide the pocket 147 open only in the forward direction; except for slot 150.

An optional guide element is also shown in FIG. 7 at 154 and is provided with the through slot 156 arranged at a diagonal to the direction perpendicular to tooling bar 144. The optional guide element 154 can be connected to the rearward end of tooling bar 144 (not shown in FIGS. 4, 5, and 6) and is intended to be used with a vertically arranged pusher tape and pusher system. In that case, the pocket stop 148 would instead have a vertical slot 150 instead of that shown horizontal at slot 150. By this, the rear pusher assembly 62 of the present invention can accommodate both vertically and horizontally arranged pusher tapes which are selectively desirable depending upon the type of part to be dispensed from a specifically designed supply tube. As can be seen in FIG. 3, pusher 72 is limited in rearward movement by the pocket stop 148 and to reside within pocket 147 when fully retracted. Again, opening 76 of rear stop 78 facilitates movement of pusher 72 therethrough but does not permit tube 16 to move rearwardly.

Figure 8:
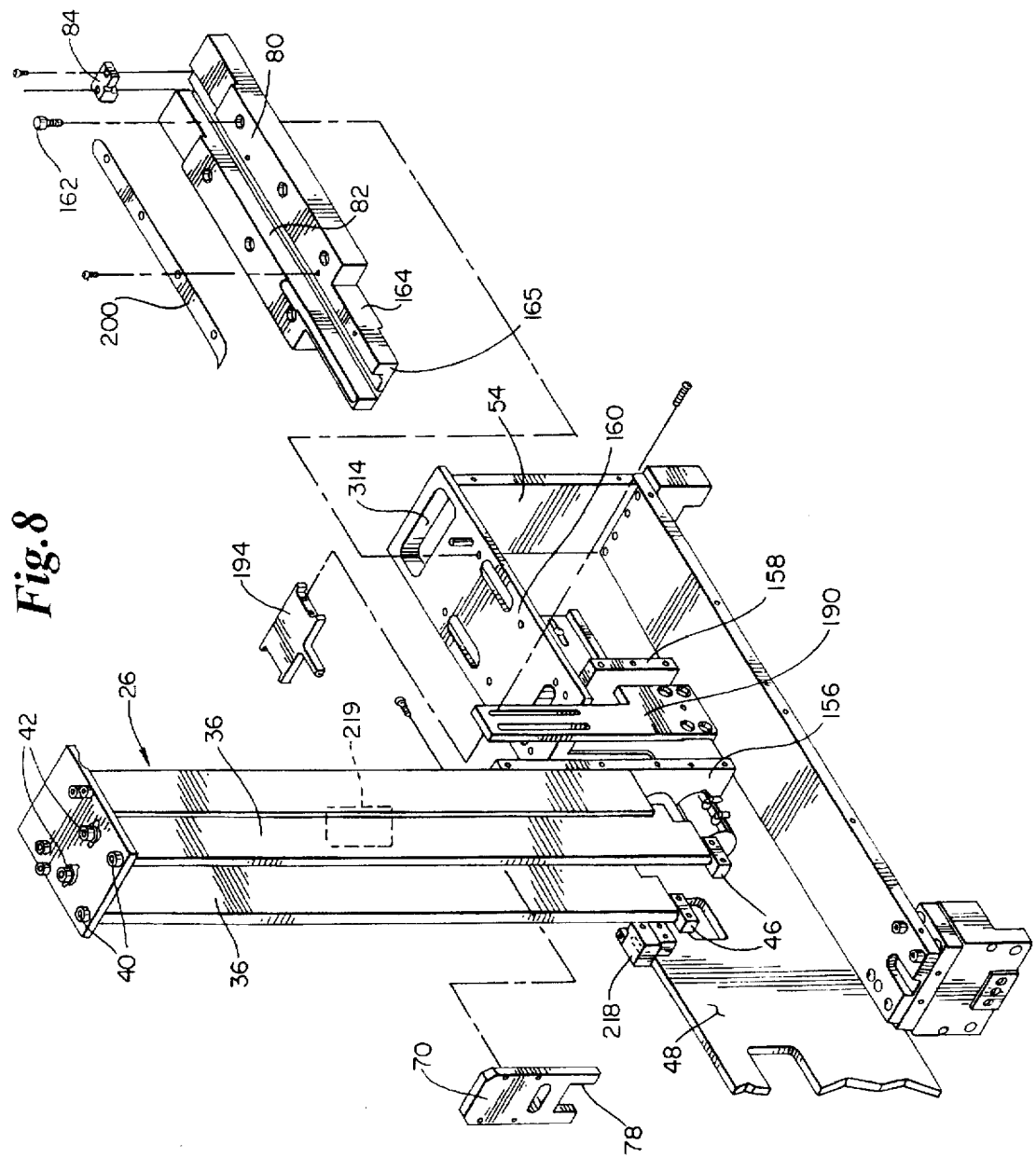
FIG. 8 is an enlarged partial perspective view of the feed track end of the stack tube feeder of FIG. 2 illustrating the feed track, a front stop, and an upper front singulator exploded from the feeder assembly.
Figure 9:
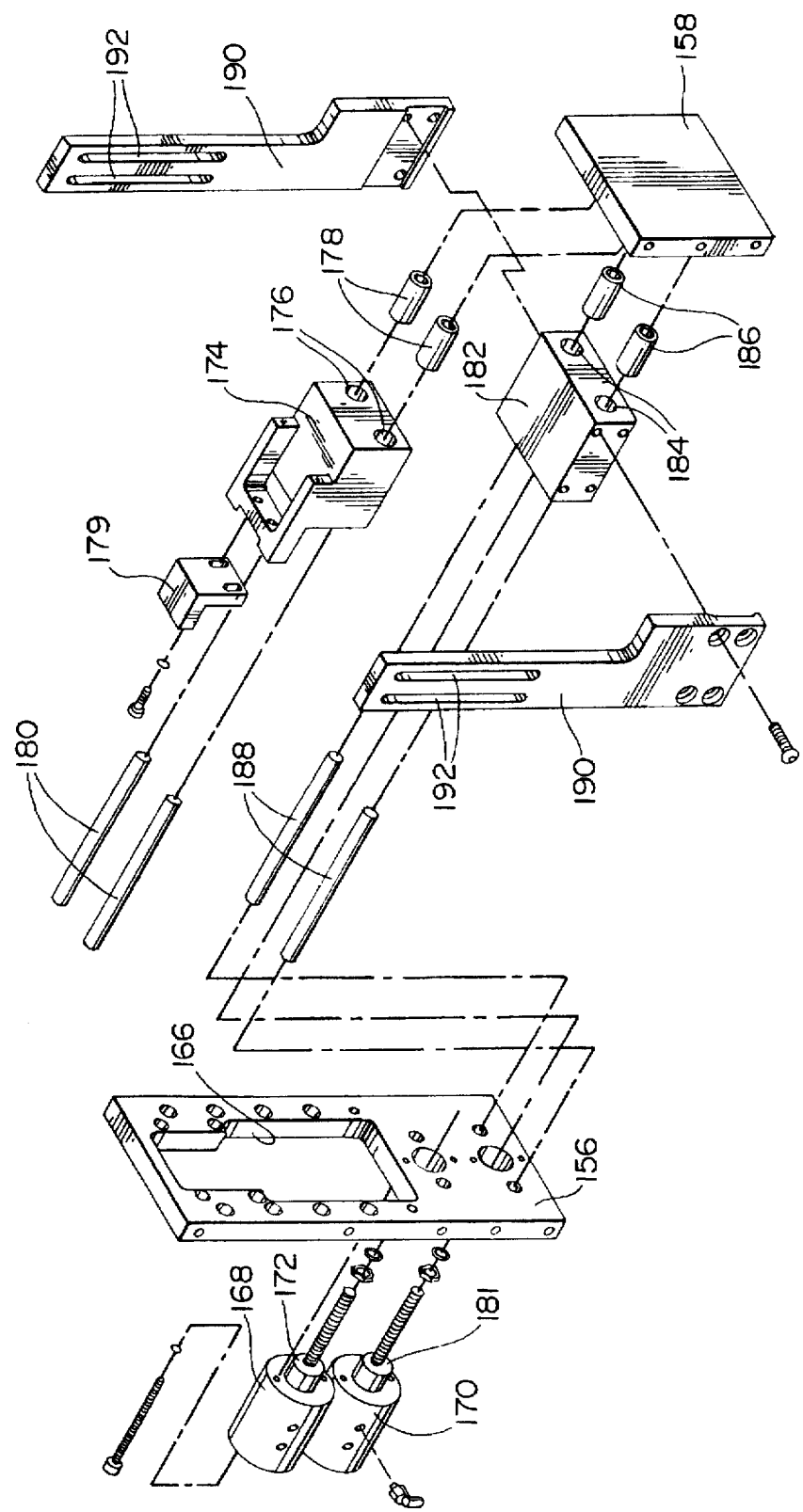
FIG. 9 is an exploded partial view of the front singulator system of FIG. 8 in reverse perspective.

Referring now to FIGS. 8 and 9 the feed track assembly 64 located forward of the tube guide assembly 14 will be described. Supporting structure for the feed track assembly 64 includes end plate 54, back support plate 156, middle support plate 158, and top support plate 160. End plate 54, back support plate 156, and middle support plate 158 are each secured to and lie in between the first and second sidewalls 48 and 50, respectively, of the housing 12. Top support plate 160 preferably mounts on the top edges of the end plate 54 and the middle support plate 158. Back support plate 156 is preferably spaced sufficiently from the middle support plate 158 to provide the necessary functions described below.

The aforementioned track plate 80 mounts to the top support plate 160 by conventional means such as screws 162. Note that the track plate 80 includes a reduced width portion 164 which extends over the gap created between the middle support plate 158 and the back support plate 156 and extends to within an opening 166 provided through the back support plate 156, see FIG. 9. Back support plate 156 is adjacent the second guide 26 of the tube guide assembly 14 and is preferably used to mount the back support wall 44 of the second guide 26 in place. The back edge 165 of the reduced width portion 164 of track plate 80 preferably extends sufficiently rearward so that parts pushed from a tube 16 immediately enter into the component guide track 82 thereof. Note that front stop 70 prevents the tube 16 from moving forward.

In order to provide the function of ejecting a used tube 16 while holding a tube just above in place and subsequently dropping the new supply tube into the feed guide path, an upper air cylinder 168 and a lower air cylinder 170 are provided connected with the back support plate 156. Specifically, upper air cylinder 168 is mounted to the back support plate 156 just below the opening 166 and with its rod 172 extendable through an opening of the back support plate 156. The rod 172 is connected with a front tube support slide block 174 for movement therewith between an extended and retracted positions. The front tube support slide block 174 is provided with parallel bores 176 within which bearing inserts 178 are provided and which ride on upper guide rods 180 which are fixed between the middle support plate 158 and the back support plate 156. Attached at the back end of the front tube support slide block 174 (that is, away from the middle support plate 158) is a front tube support 179. When the rod 172 of the upper air cylinder 168 is retracted, the top surface of the front tube support 179 extends through the opening 166 sufficiently to provide support to the bottom of a lowermost tube which lies within the feed guide path. When rod 172 is extended, the front tube support 179 moves at least within the opening 166 so as not to lie below the front edge of the lowermost guide tube.

The lower air cylinder 170 is similarly attached to the back support plate 156 and includes a rod 181 that extends through an opening of back support plate 156. Rod 181 is attached to a lower slide block 182 also having a pair of parallel bores 184 which preferably receive bearing inserts 186 for sliding movement over the lower guide rods 188 which are fixed between the back support plate 156 and the middle support plate 158. Slide block 182 is thus moveable between the extended and retracted position with the rod 181 as guided by the lower guide rods 188.

Attached to the sides of the lower slide block 182 are a pair of support arms 190 which extend upwardly beyond the front tube support 179 and its slide block 174. Along the upper portion of each of the support arms 190, a pair of adjustment slots 192 are provided. As best seen in FIG. 8, these adjustment slots 192 provide mounting means for a front singulator finger 194o By way of screws extending through the slots 192 and secured to the front singulator finger 194, the front singulator finger 194 can be vertically located anywhere along the length of slots 192. By this adjustment mechanism, the finger portion 196 of the front singulator finger 194 can be positioned to extend through a slot 198 provided through the front stop 70 just above the opening 78. When the rod 181 of the lower air cylinder 170 is retracted, lower slide block 182 and support arms 190 are positioned near to the back support plate 156 so that the finger portion 196 of the front singulator finger 194 extends through the opening 166 of the back support plate 156 and through the slot 198 of the front stop 70. In this position, finger portion 196 can extend into a second to the lowest part tube 16 to keep it from moving downwardly while the lowermost tube is discarded.

An optional additional feature is a hood 200 shown in FIG. 8 that may be secured to the track plate 80 so as to cover substantially all of the component guide track 82 except the component or components that are set to be picked by a robot. The hood prevents the parts within the guide track 82 from lifting under the influence of the applied force from the rear and also prevents the part that is being picked from disturbing the part that is next in line. The provision of the hood 200 is preferable in those situations where the parts or components have a tendency to lift under the applied force from the rear or run the risk of being disturbed during the pick process.

The stack tube feeder 10 of the present invention also preferably includes a sensor system which in conjunction with the programmable logic controller 66 controls the operation of the stack tube feeder automatically. That is, after one supply tube (the lowermost one within the feed guide path) is empty, that tube is to be discarded and a new one provided in place within the feed guide path automatically. Moreover, it is preferable to provide indicator lights, such as shown generally at an indicator panel 202 in FIGS. 1 and 2, and/or to stop the motor 96 upon the sensing of certain predetermined conditions.

In order to sense when the feed tube 16 is empty and thus a changeover is necessary, a first sensor can be provided along the component guide track 82, such as within a slot 204 shown in FIG. 3 at 206. To activate the sensor 206, a magnet 208 can be provided along the length of the pusher tape 74, preferably the magnet is mounted in the pusher 72. The first sensor 206 can be a conventional Hall effect sensor which senses the presence of the magnet 208 adjacent thereto within the component guide track 82. First sensor 206 is preferably adjustably provided within the slot 204 and adjustable in position by conventional means such as a set screw arrangement.

Similarly, a second sensor can be provided adjacent the pocket 147, and particularly mounted to the outside of the pocket side cover 152 as shown in dashed lines at 210. Again sensor 210 can be a Hall effect type sensor which senses the presence of magnet 208 when the pusher 72 is fully retracted within the pocket 147. Preferably, the sensor 210 is provided within a groove 212 along the side of the side cover 152 of the pocket so that the position of the sensor 210 can be adjusted along the length of the groove and fixed in position, such as by a conventional set screw arrangement.

As an alternative to the use of a magnet provided in the pusher 72 combined with the multiple Hall effect type sensors 206 and 210, an optical sensor can be provided between the pocket stop 148 and the reeler 112. Then, by the use of holes provided through the pusher tape 74 (or another anomaly of the tape that can be sensed, i.e. reflective or non-reflective spots) at the appropriate positions indicating the extended and retracted positions of the pusher 72, the optical sensor can be triggered.

Another sensor preferably provided is a part present sensor 214 provided at the end of the component guide track 82 just adjacent the track stop 84. Preferably, the part present sensor 214 comprises an optical sensor, which in a conventional sense (i.e. use of the reflective nature of the part), determines the presence of a part over it. Yet another optical sensor may be utilized as an orientation sensor 216 located along the component guide track 82 intermediate the first sensor 206 and the part present sensor 214. The use of such an orientation sensor 216 depends largely on the type of part being dispensed. The orientation sensor 216 can be set to look for the presence or absence of a product or a portion thereof located in the component guide track 82 just in front of the orientation sensor 216. In other words, the orientation sensor 216 may look for an open area of the part to check whether the part is in proper orientation, or may look for a specific portion of the part which should be located in front of sensor 216 in proper orientation.

Another sensor is preferably provided, as shown in FIGS. 2 and 8 at 218. Sensor 218 is provided to monitor whether a tube is ready in the position just above the tube of the feed guide path. In other words, the sensor 218 indicates whether or not a full tube is in the stack for the next changeover. Preferably, an optical sensor is used; however, a micro-switch type sensor could instead be provided. Sensor 218 can be electrically connected with one of the indicator lights of the indicator panel 202 to provide a warning light when a next tube ready situation is not determined. Alternatively, the sensor 218 may provide a signal to an indicator light indicating that a tube is ready, that is positioned in the staging position directly in front of the sensor 218, (as opposed to indicating when an error exists) so that the indicator light remains on so long as a tube is ready in the staging position.

Yet another sensor 219 is preferably provided for sensing a low parts condition and is located within the tube guide assembly 14. As shown in FIG. 8, the sensor 219 preferably comprises a micro-switch positioned along the back support wall 44 of the second guide 26 at a predetermined distance above the feed guide path. When a tube is present in the tube guide assembly 14 at the predetermined distance, the micro-switch is closed which is used to indicate that there are sufficient tubes and thus parts within the tube feeder. When the number of supply tubes falls below that point, the micro-switch opens and a signal is sent indicating a low number of tubes in the stack, preferably to an indicator light within the indicator panel 202. An operator would thus be warned that additional supply tubes must be loaded within the stack tube feeder 10.

Likewise, the part present sensor 214 and the orientation sensor 216 can be operatively connected with one of the indicator lights of indicator panel 202 to provide signals indicating that a part is properly nested in the pick-up position and that the parts are properly orientated. In addition or alternatively, these sensors 214 and 216 can be connected with an indicator light providing a signal of an error condition. The sensing of an error condition from any of the aforementioned sensors can also be utilized to signal the shutdown of drive motor 96, if desired.

The operation of the stack tube feeder 10 including a changeover from one tube within the feed guide path to the next tube will now be described. When the stack tube feeder 10 is turned on, the drive motor 96 causes a frictional drive by way of the drive roller 100 and tension roller 102. Initially, the pusher tape 74 has been threaded between the drive and back-up rollers 100 and 102, through opening 114 of intermediate support plate 94 of the rear pusher assembly 62, and the pusher 72 is nested within the pocket 147 and against the pocket stop 148. When the drive roller 100 is driven, the pusher tape 74 is driven forwardly (in the feed direction) by friction. Pusher 72 is thus advanced through opening 76 of rear stop 78 and into the opening of supply tube 16. Pusher 72 will continue to be driven forward while parts are pushed from supply tube 16 through opening 78 of front stop 70 and into the component guide track 82. Once a leading part engages the track stop 82, and the component guide track 82 is filled with parts provided in a single file line, advance of pusher 72 is halted. Drive motor 96 can continue to run, but by virtue of the adjustable frictional drive of rollers 100 and 102, the pusher tape 74 can slip so that it is not driven forward.

During this normal operating state, the rear tube support 138 is positioned under the rear end of the supply tube 16. That is, the lower air cylinder 118 of the rear pusher assembly 62 is extended in the normal running state. Likewise, the front tube support 179 is positioned under the front edge of supply tube 16 by virtue of the upper air cylinder 168 of the feed track assembly 64 being retracted. Also at this time, the rear singulator finger 128 and the front singulator finger 194 are preferably not positioned within the ends of the next to the last supply tube just above the tube 16 of the feed guide path. To accomplish this, the upper air cylinder 116 of the rear pusher assembly 62 is retracted while the lower air cylinder 170 of the feed track assembly 64 is extended. Having the front and rear singulator fingers 128 and 194 out of the tube guide assembly 14 facilitates easy stacking of new supply tubes 16 within the tube guide assembly During further operation, the leading part located against the track stop 84, and as sensed by part presence sensor 214, is picked by a robot in such an assembly system. After the leading part is picked, pusher tape 74 is driven forwardly to advance pusher 72 and a new leading part to the stop position. Thus, a continual supply is provided for pick-up by a robot.

During normal operation, the programmable logic controller 66 monitors its sensors not only for determining error conditions, but also to control operation. Specifically, sensor 206 determines whether or not the pusher 72 is extended through the supply tube 16, through opening 78 of front stop 70, and into the component guide track 82 up to the sensor 206. If not, controller 66 continues to drive motor 96. When magnet 208 is sensed in front of the sensor 206 within the component guide track 82, a changeover operation is initiated. The first step is to retract the pusher 72 by reverse driving of motor 96 and/or allowing the spring retraction of the reeler 112 to pull pusher 72 back through the supply tube 16 of the feed guide path, through opening 76 of the rear stop 68 and into the pocket 147 against pocket stop 148. Retraction is continued until the point that the magnet 208 is positioned in front of the sensor 210 provided on the side cover 152 of the pocket. At that point, retraction is stopped. Then, the actual tube changeover takes place.

The first step in the changeover is to position the rear singulator finger 128 and the front singulator finger 194 through the slots 142 and 198 of the rear stop 68 and front stop 70, respectively, and into the ends of the supply tube 16 just above the supply tube 16 of the feed guide path. Thus, the new supply tube is vertically secured. This is specifically accomplished by extending the upper cylinder 116 of the rear pusher assembly 62 while retracting the lower cylinder 170 of the feed track assembly 64.

The next step is to let the empty supply tube 16 fall out from the stack tube feeder 10. This is accomplished by moving the rear tube support 138 and the front tube support 179 from positions underneath the supply tube 16 of the feed guide path. Specifically, the lower cylinder 118 of the rear pusher assembly 62 is retracted, while the upper cylinder 68 of the feed track assembly 64 is extended.

After a time delay sufficient to ensure that the empty supply tube 16 drops from the stack tube feeder 10, the rear tube support 138 and front tube support 179 are repositioned under the tube guide assembly 14 to vertically hold a next supply tube within the feed guide path. Specifically, the lower cylinder 118 of the rear pusher assembly 62 is extended, while the upper cylinder 168 of the feed track assembly 64 is retracted.

The last step of the changeover operation is to drop a new part supply tube 16 into place within the feed guide path. This is done by moving the rear singulator finger 116 and the front singulator finger 194 from their position vertically holding the new supply tube to positions outside of the tube guide assembly 14 so that the new tube will fall down upon the rear tube support 138 and the front tube support 179. Specifically, the upper cylinder 116 of the rear pusher assembly 62 is retracted, while the lower cylinder 170 of the feed track assembly 64 is extended. At this point, and so long as the tube ready sensor 218 indicates that the tubes are properly set, normal operation resumes. That is, motor 96 is driven to drive pusher tape 74 and pusher 72 forwardly to advance the new parts from the new supply tube 16 provided within the feed guide path.

A significant advantage of the present invention, is that the stack tube feeder 10 can easily be modified to accommodate different components or parts. As stated above, the supply tubes 16 are designed dependent on the parts provided therein. Moreover, the component guide track 82, and opening 78 of the front stop 70 must be designed in accordance with the specific part being dispensed. As is apparent from the description above, the track plate 80, front stop 70, rear stop 68, front singulator finger 194, and rear singulator finger 128 are easily replaceable and/or adjustable. The front and rear singulator finger 194 and 128, respectively, are adjustable vertically to accommodate different spacing of the stack of tube 16. Likewise, slots 198 and 142 of the front and rear stops 70 and 68, respectively, must be positioned accordingly. It is also contemplated that the finger portion 196 of the front singulator finger 194 and that of the rear singulator finger 128 may need to be changed depending on the cross sectional shape of the supply tube 16. Thus, different front and rear singulator fingers 194 and 128 can be readily exchanged. The pusher 72 may also be substituted with other pushers designed more specifically for the cross section of a specific supply tube 16. Such may also require the substitution of one or more of the pocket forming components to make a new pocket design. Moreover, and as noted above, the pusher tape 74 can instead be driven vertically by adding optional guide element 154 in the rear pusher assembly 62 and by modifying the pocket stop 148 to have a vertical slot instead of horizontal slot 150.

Figure 10:
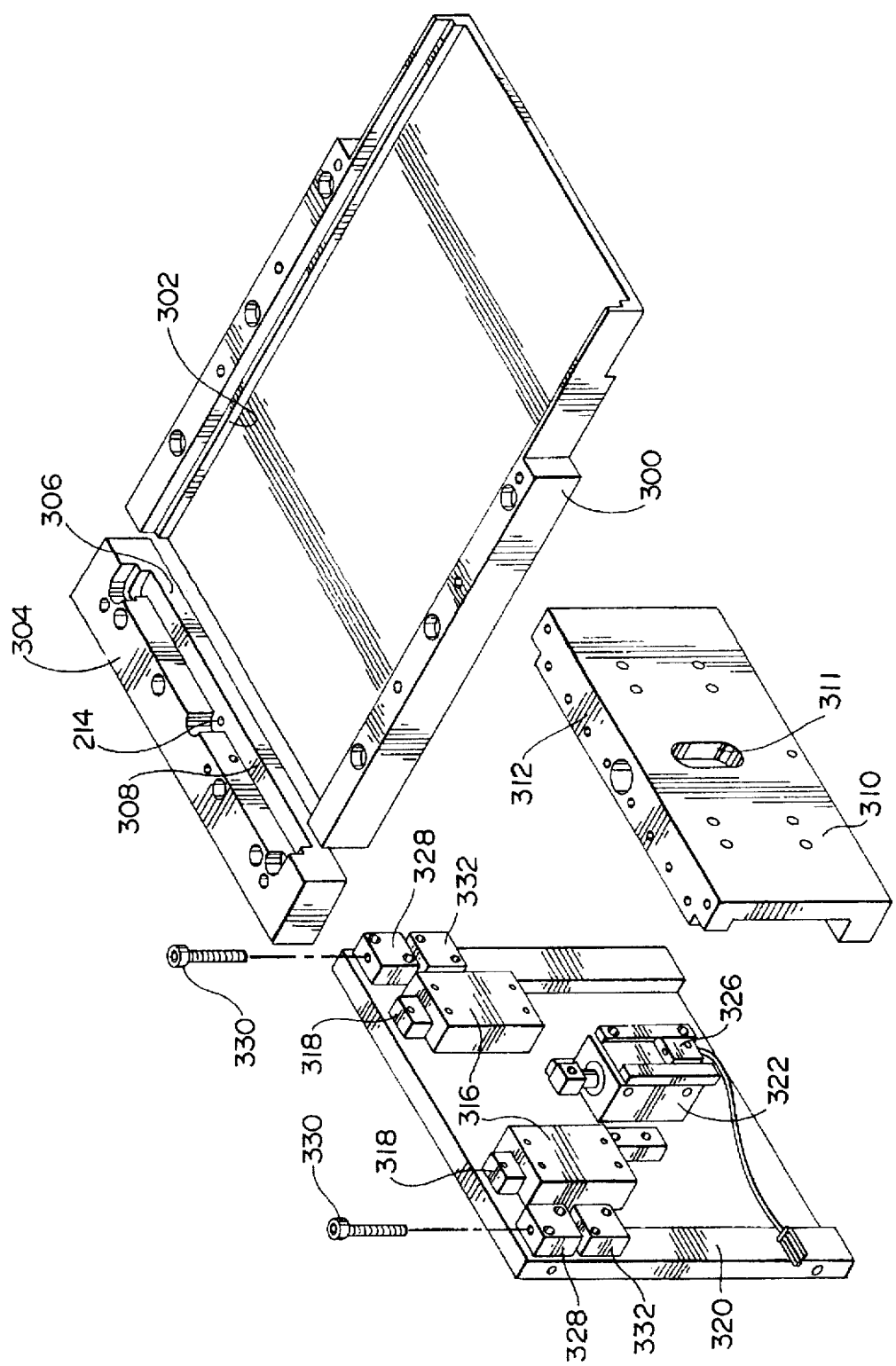
FIG. 10 is an exploded perspective view of an optional lift nest assembly that can be provided at the feed end of the feed track instead of a track stop.

An additional feature can be provided by the optional assembly shown in FIG. 10. The purpose of this feature is to provide a lift nest which duplicates track features and stop features but is lifted vertically while the rest of the guide track, with a single file column of parts remains stationary. This lift feature is provided when there is a need to vertically singulate the part that is to be picked by a robot. This case arises when, typically for transverse mounted components, there is no separation between components in the short axis of the component which doesn't leave room for typical gripping of the component. The feature includes a shortened track 300 which lacks the track stop and sensors as described earlier in regard to track plate 80. Note that the perspective view of FIG. 10 is in reverse to that of FIG. 8. Shortened track 300 is illustrated with a wide guide track 302, such as usable for guiding transverse mounted components. A lift nest 304 completes the feed guide path by providing a stop surface 306 and a track portion 308, as well as provisions for part present sensor 214 and an orientation sensor if needed. The shortened track 300 with the lift nest 304 together replace the track element 80 of the above embodiments.

The lift nest 304 also includes mounting holes to fasten it to the top of a lift plate 310 which moves vertically from having its top surface 312 flush with the bottom side of the track 300 to a settable height approximately ¼ inch above the bottom of track 300. The lift plate 310 extends through a hole 314 in the top plate of the feeder, such as plate 160 in FIG. 8. The lift plate 310 is connected with two slides 316 slidable on guides 318 that are mounted to a front plate 320 of the feeder. Plate 320 is similar to the plate 54 of FIG. 8. Lift plate 310 is further conventionally connected at slot 311 to an extendible rod 324 of an air cylinder 322, the body of which is mounted to the plate 320. As can be seen, movement of the rod 324 of the air cylinder moves lift plate 310 up and down as guided by slides 316 on guides 318. A position sensor 326 can be used to determine position of the lift plate 310. Also attached to the front plate 320 are two stationary blocks 328 which include a threaded hole for adjustment screws 330 to go through. Adjustable blocks 332 are vertically adjustably mounted to the plate 320 in adjustment slots (not shown) so that the adjustment screws 330 contact their upper surfaces. By rotating the adjustment screws 330, the vertical position of blocks 332 can be adjusted. The lift plate 310 includes a flange 334 having a surface that engages with the lower surfaces of the adjustable blocks 332 at the upper extent of the lift plate 310 movement. Thus, the lifted height of the lift plate 310 can be set. The operational sequence of this feeder is very similar to that of a regular feeder with the exception of lifting of the nest 304 when the component contacts the stop surface 306 of the nest as sensed by sensor 214 and controlled by the controller 66. After the component has been removed, the nest 304 is lowered to the level of the rest of the track and another component is pushed forward.

Figure 11:
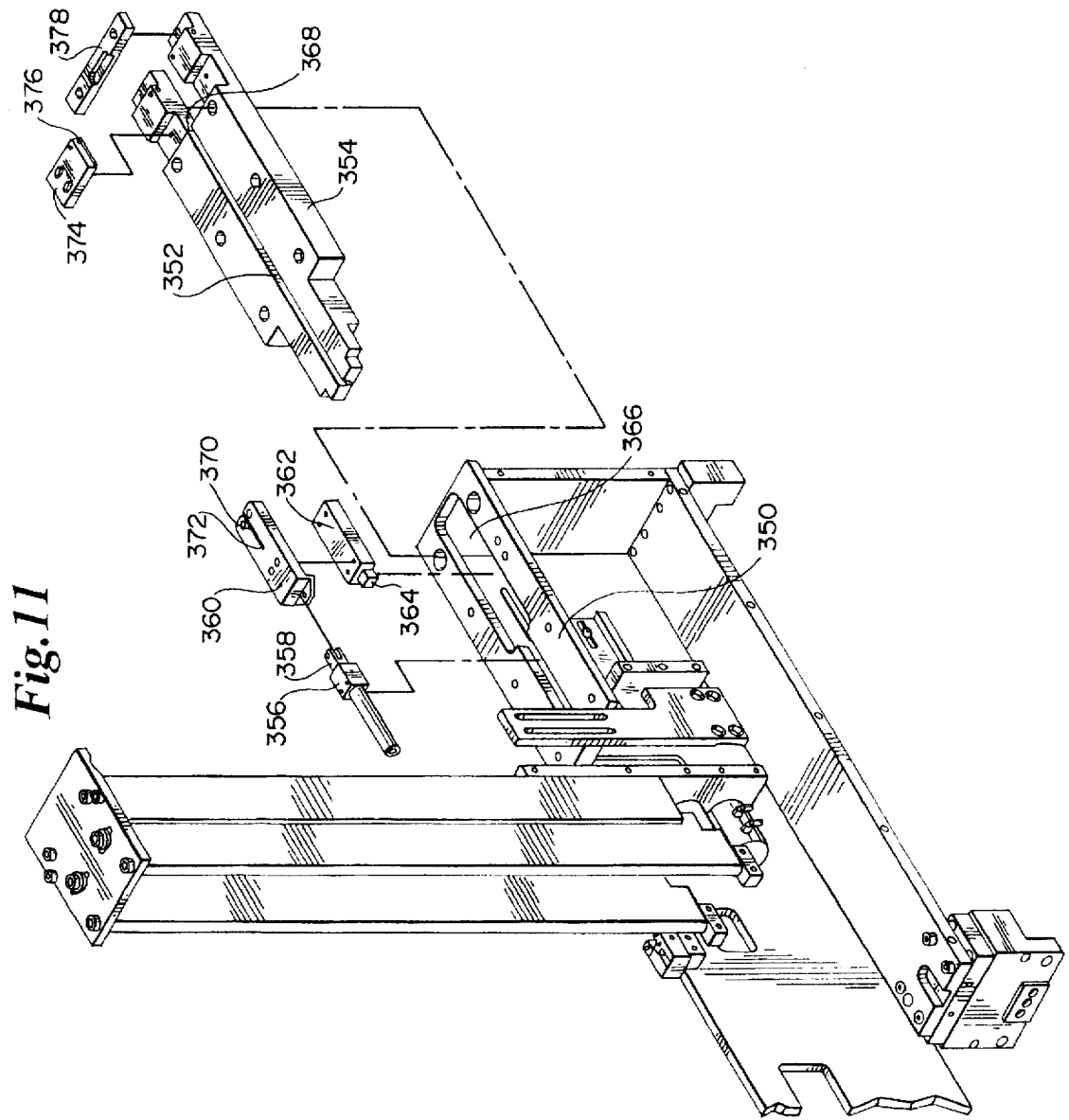
FIG. 11 is a partial perspective view of an optional feed track assembly having a soft feed including a shuttle for shifting a part to the pick-up location from the feed track.
Figure 12:
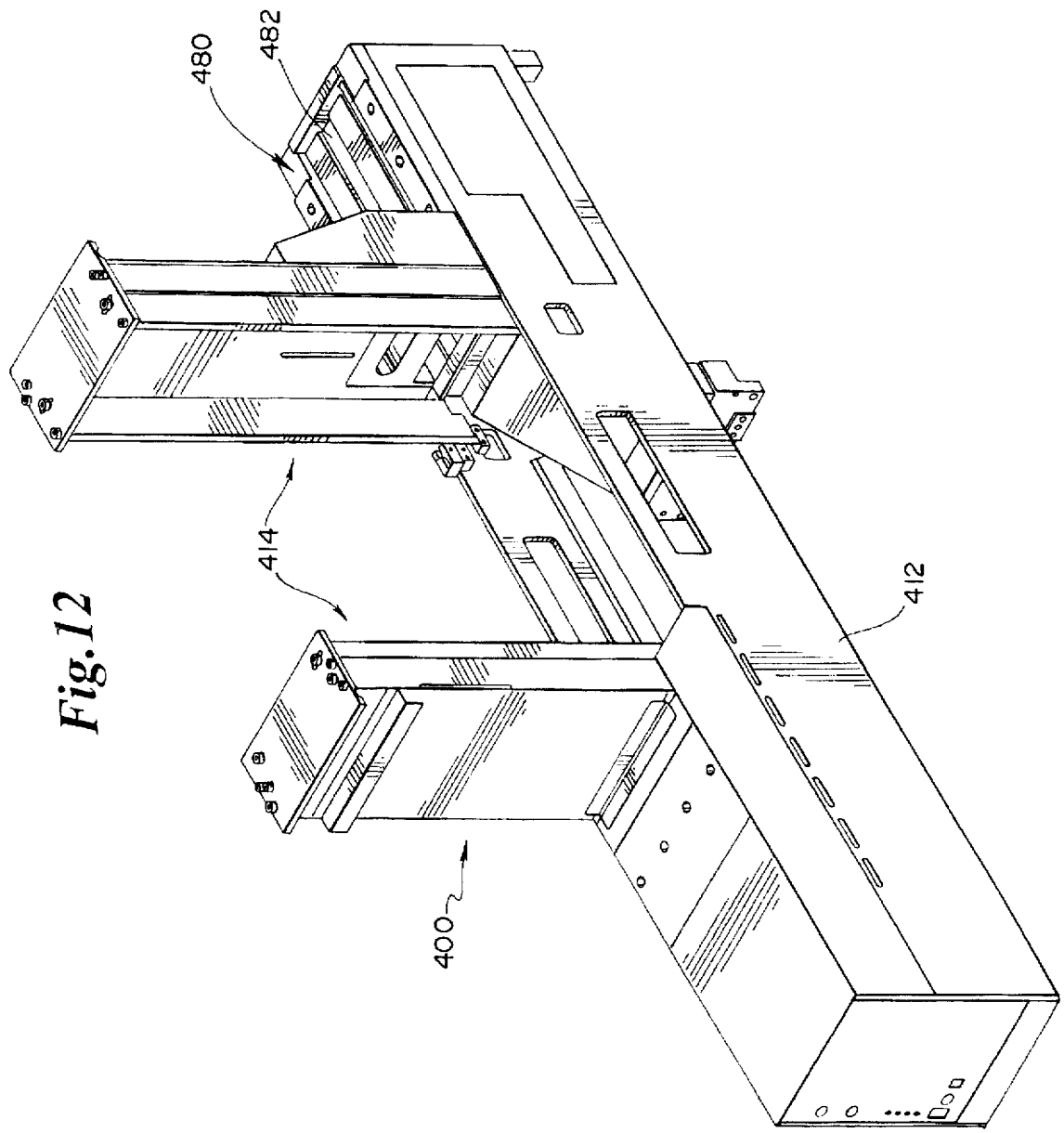
FIG. 12 is a perspective view of another stack tube feeder in accordance with the present invention for handling and dispensing parts arranged to extend transversely through the feed track.

As yet another alternative, the track plate 80 can be provided with what is referred to as a soft feed by a replacement track plate mechanism shown in FIGS. 11 and 12. This soft feed system advantageously separates the leading component from the line of components under the applied pressure and to move the leading component to its pick location without being under any applied force. This is accomplished by incorporating a small shuttle into a feeder top plate 350, which is a substitute for the top plate 160 of FIG. 8, and lies just under the component guide track 352 of a modified track plate 354, which is a substitute for track plate 80. The shuttle comprises a pneumatic cylinder 356 mounted to the top plate 350 and having a rod 358 movable between extended and retracted positions. Rod 358 is connected to shuttle nest 360, which is connected to a linear slide 362 slidable on guide 364 fixed within a pocket area 366 of the top plate 350. Actuation of the cylinder 356 provides a retracted and extended position for the shuttle nest 360 within the pocked area 366.

The principle is to push components along the component guide track 352 until a single component is pushed off the track at a ledge 368 and into a matching component track 370 in the shuttle nest 360. This track portion 370 in the shuttle nest 360 sits at a lower height than the main component track 352, also has a ledge 372 at the rear of the track portion 370, and does not have a track stop. In its retracted position, the rear ledge 372 of the shuttle track portion 370 lies under the main component track 352 and before the ledge 368 in the direction of feed. The shuttle track portion 370 is significantly longer that a single component length to be handled. Therefore, the component is not pushed against anything when it is pushed over the ledge 368. One or more stationary lead-in guides 374 help insure that components drop correctly into the shuttle track portion 370. A guide 374 preferably also includes a sensor 376 to determine that a single component is sitting in the shuttle. When the shuttle nest 372 is extended, it moves forward a set distance until it hits a hard stop (not shown) that is provided underneath a track stop 378. The shuttle nest 372 moves underneath the track stop 378 a short distance before contacting the hard stop. Because it travel underneath the track stop 378, a component within the shuttle track portion 370 when it hits the track stop 378 is moved relatively rearwardly along the shuttle track portion until it is confined between shuttle ledge 372 and track stop 378.

Reference is made to a wide version of a stack tube feeder 400 illustrated in FIG. 12. Stack tube feeder 400 comprises a housing 412, tube guide assembly 414, and track plate 480 basically similar to the stack tube feeder 10, described above, except that the components are wider in the transverse direction of the feeder. Stack tube feeder 400 is designed to handle larger components than that of stack tube feeder 10, or can be used to feed parts that are arranged transversely, but in a single file column in the component guide track 482 of the track plate 480. Again, it is contemplated that the components of the stack tube feeder 400, including its track plate 480, front and rear singulator fingers, front and rear stops, and pusher can be readily exchanged for modification to accommodate many variations of parts or components. Thus, it is clear that with only a couple of versions of stack tube feeders, an extremely wide variety of components or parts can be handled.

It is also contemplated that a stack tube feeder, such as the wide version 400, can be modified to provide multiple feed systems. Specifically, multiple pusher arrangements can be provided to extend through part supply tubes having multiple rows of parts or components which lead into multiple component guide tracks provided within one or more track plates. If multiple individual supply tubes are arranged side-by-side to do this in addition to being stacked on top of one another, multiple singulators and tube support mechanisms would be necessary. Moreover, the controller 66 would preferably have separate circuits for each feeder line.

What is claimed is:

1. A part feeder for use in a robotic assembly system for dispensing parts that are supplied within the feeder in tubes, said part feeder comprising:

a support;

a tube guide assembly for holding a plurality of part supply tubes and for defining a feed position for a part supply tube within a feed guide path of the part feeder, said tube guide assembly comprising a first guide member for positioning one end of a part supply tube, said first guide member connected to said support and having a front stop that is removable from said first guide member while said first guide member is connected to said support, said front stop for preventing movement of a part supply tube when in said feed position toward a feed end of said part feeder but including an opening for permitting parts from the part supply tube to pass through in the direction of said feed end, and a second guide member for positioning a second end of a part supply tube, said second guide member connected to said support and having a rear stop that is removable from said second guide member while said second guide member is connected to said support, said rear stop for preventing movement of a part supply tube when in said feed position away from said feed end and having an opening providing access to the part supply tube, said tube guide assembly further defining a staging position for a part supply tube and comprising a front singulator element movably disposed to said support between a position to support a front end of a part supply tube and a non-supporting position, and a rear singulator element movably disposed to said support between a position to support a rear end of a part supply tube and a non-supporting position, wherein said front stop includes a slot through which said front singulator element can pass between its supporting and non-supporting positions, and said rear stop includes a slot through which said rear singulator element can pass between its supporting and non-supporting positions;

a feed track assembly provided along said feed guide path and positioned for guiding parts from a part supply tube when in said feed position, including a track element removably attached to said support and having a guide track providing a portion of said feed guide path and a track stop for defining a reference location usable by the robotic assembly system; and a pusher means operatively positioned before said tube guide assembly for applying a force against a part within a part supply tube by way of said access opening of said rear stop and thereby advancing the parts from a part supply tube and along said feed track.

2. The part feeder of claim 1, further comprising a front tube support movably disposed to said support between a position to support a front end of a part supply tube in said feed position and a non-supporting position, and a rear tube support movably disposed to said support between a position to support a rear end of a part supply tube in said feed position and a non-supporting position, whereby when the front and rear tube supports are moved into non-supporting positions, a part supply tube can be removed from said part feeder.

3. The part feeder of claim 2, wherein said front and rear singulator elements are also each adjustably mounted to said support so that they can be adjusted in a direction of which the part supply tubes are to be stacked upon one another as defined by said tube guide assembly.

4. The part feeder of claim 3, wherein said front and rear tube supports and said front and rear singulator elements are each movably disposed with respect to said support by way of an independent shifting means for moving each between supporting and non-supporting positions independently, and further comprising a control means for initiating each movement.

5. The part feeder of claim 4, wherein each of said front and rear tube supports and said front and rear singulator elements are also removably mounted to their respective shifting means.

6. The part feeder of claim 1, wherein said feed track assembly further comprises a movable track element portion with a guide track portion adjacent to the feed end of said guide track and means for shifting said movable track element portion in the direction of said guide track between the remainder of said track element and said track stop so that a part within said guide track portion can be shuttled from an end of the remainder of said guide track of said track element to said track stop.

7. The part feeder of claim 6, wherein said track element portion is movable within a plane that is offset from a plane of the remainder of said track element and includes a back stop for contacting a part within said guide track portion when that part is shuttled to said track stop.

8. The part feeder of claim 1, wherein said pusher means further comprises a pusher support assembly attached to said support, a pusher tape, tape guide means for guiding said pusher tape along said feed guide path to said access opening of said rear stop, drive means for moving said pusher tape along said guide means, and a pusher element attached to said pusher tape to be moved along said feed guide path and for passing through said access opening of said rear stop.

9. The part feeder of claim 8, wherein said rear stop is removably attached to said pusher support assembly adjacent to said second guide member of said tube guide assembly.

10. The part feeder of claim 9, wherein said tape guide means includes a pocket forming assembly dimensioned for receiving said pusher element therein and connected to said pusher support assembly comprising a pocket stop that limits movement of said pusher element in a direction away from said access opening of said rear stop.

11. The part feeder of claim 10, wherein said pusher element and said pocket forming assembly are removably connected to said pusher tape and said pusher support assembly, respectively.

12. The part feeder of claim 11, further including a control means for controlling said drive means to move said pusher tape forwardly and reversely, and sensor means connected with said control means for signalling when said pusher element has been advanced through a part supply tube in said feed position and when said pusher element is positioned within said pocket forming assembly.

13. The part feeder of claim 1, wherein said feed track assembly further comprises a movable track element portion with a guide track portion and track stop at the feed end of said guide track and a means for selectively lifting said track element portion so that a part within said guide track portion and at the reference location can be raised for pick-up by a robot, and while said guide track portion is raised, a next part cannot enter said guide track portion.

14. A part feeder for use in a robotic assembly system for dispensing parts that are supplied within the feeder in tubes, said part feeder comprising:

a support;

a tube guide assembly for holding a plurality of part supply tubes and for defining a feed position for a part supply tube within a feed guide path of the part feeder, said tube guide assembly comprising a first guide member connected to said support for positioning one end of a part supply tube, and a second guide member connected to said support for positioning a second end of a part supply tube;

a feed track assembly provided along said feed guide path and positioned for guiding parts from a part supply tube when in said feed position, including a track element attached to said support and having a guide track providing a portion of said feed guide path, wherein said feed track assembly further comprises a movable track element portion with a guide track portion and track stop at the feed end of said guide track and a means for selectively lifting said moveable track element portion so that a part within said guide track portion and at the reference location can be raised for pick-up by a robot, and while said guide track portion is raised, a next part cannot enter said guide track portion; and a pusher means operatively positioned before said tube guide assembly for applying a force against a part within a part supply tube and thereby advancing the parts from a part supply tube and along said feed track.

15. A part feeder for use in a robotic assembly system for dispensing parts that are supplied within the feeder in tubes, said part feeder comprising:

a support;

a tube guide assembly for holding a plurality of part supply tubes and for defining a feed position for a part supply tube within a feed guide path of the part feeder, said tube guide assembly comprising a first guide member connected to said support for positioning one end of a part supply tube, and a second guide member connected to said support for positioning a second end of a part supply tube;

a feed track assembly provided along said feed guide path and positioned for guiding parts from a part supply tube when in said feed position, including a track element with a ledge removably attached to said support and having a guide track providing a portion of said feed guide path and a track stop for defining a reference location usable by the robotic assembly system, wherein said feed track assembly further comprises a movable track element portion with a guide track portion adjacent to the feed end of said guide track and means for shifting said movable track element portion in the direction of said guide track between the ledge of said track element and said track stop so that a part within said guide track portion can be shuttled from the ledge of said guide track of said track element to said track stop; and a pusher means operatively positioned before said tube guide assembly for applying a force against a part within a part supply tube and thereby advancing the parts from a part supply tube and along said feed track.

16. A modification kit for use in a part feeder of the type having a tube guide assembly for holding a plurality of part supply tubes and for defining a feed position for a part supply tube within a feed guide path of the part feeder, the tube guide assembly comprising a first guide member for positioning a first end of a part supply tube and having a front stop that is removable from the first guide member, the front stop for preventing movement of a part supply tube when in the feed position toward a feed end of the part feeder but including an opening for permitting parts from the part supply tube to pass through in the direction of the feed end, and a second guide member for positioning a second end of a part supply tube and having a rear stop that is removable from the second guide member, the rear stop for preventing movement of a part supply tube when in the feed position away from the feed end and having an opening providing access to the part supply tube, the tube guide assembly also defining a staging position for a part supply tube including front and rear singulator elements that are movable between supporting and non-supporting positions; a feed track assembly provided along the feed guide path and positioned for guiding parts from a part supply tube when in the feed position, including a removable track element and having a guide track providing a portion of the feed guide path and a track stop for defining a reference location usable by the robotic assembly system; and a pusher means operatively positioned before the tube guide assembly for applying a force against a part within a part supply tube by way of the access opening of the rear stop and thereby advancing the parts from a part supply tube and along the feed track, said modification kit comprising:

the removable track element having a guide track designed to accommodate sliding of a particular type part along the guide track;

the front stop having the opening for permitting the particular part from a part supply tube to pass through and further comprising a slot through which the front singulator element can pass; and the rear stop having the access opening and further comprising a slot through which the rear singulator can pass.

17. The modification kit of claim 16, further including the front singulator element which is used for selectively supporting and non-supporting front end of a part supply tube provided in the staging position of the part feeder, and the rear singulator element which is used for selectively supporting and non-supporting a rear end of a part supply tube provided in the staging position of the part feeder.

18. The modification kit of claim 17, further including a pusher element to be used as part of the pusher means of the part feeder and suitable for passing through a part supply tube containing a particular type part.

* * * * *

UNITED STATES PATENT AND TRADEMARK OFFICE
CERTIFICATE OF CORRECTION

PATENT NO. : 5,733,093
DATED : March 31, 1998
INVENTOR(S) : Palm et al.

It is certified that error appears in the above-indentified patent and that said Letters Patent is hereby corrected as shown below:

In Col. 18, line 34, after "non-supporting--, please insert --a--

In Col. 18, line 41, after "through", please insert --said access opening of said rear stop and passing through--

Signed and Sealed this

Thirtieth Day of June, 1998

*Attest:*

BRUCE LEHMAN

*Attesting Officer*          *Commissioner of Patents and Trademarks*